(12) United States Patent
Frantz et al.

(10) Patent No.: US 10,590,291 B2
(45) Date of Patent: Mar. 17, 2020

(54) RADIATION CURABLE COMPOSITION COMPRISING HYDROPHILIC NANOPARTICLES

(71) Applicant: BASF Coatings GmbH, Münster (DE)

(72) Inventors: Richard Frantz, Village-Neuf (FR); Bernhard Sailer, Ranspach le Haut (FR)

(73) Assignee: BASF COATINGS GMBH, Münster (DE)

( * ) Notice: Subject to any disclaimer, the term of this patent is extended or adjusted under 35 U.S.C. 154(b) by 0 days.

(21) Appl. No.: 15/534,141

(22) PCT Filed: Dec. 16, 2015

(86) PCT No.: PCT/EP2015/079913
§ 371 (c)(1),
(2) Date: Jun. 8, 2017

(87) PCT Pub. No.: WO2016/096937
PCT Pub. Date: Jun. 23, 2016

(65) Prior Publication Data
US 2017/0342183 A1    Nov. 30, 2017

(30) Foreign Application Priority Data
Dec. 18, 2014  (EP) .................................. 14198716

(51) Int. Cl.
*C08F 222/10*     (2006.01)
*H01L 51/52*      (2006.01)
(Continued)

(52) U.S. Cl.
CPC .......... *C09D 7/67* (2018.01); *C08F 222/1006* (2013.01); *C08J 5/18* (2013.01);
(Continued)

(58) Field of Classification Search
CPC ... C09D 7/67; C09D 7/61; C09D 7/68; C09D 4/00; C08F 222/1006; C08F 2222/1013;
(Continued)

(56) References Cited

U.S. PATENT DOCUMENTS 5,244,707 A    9/1993  Shores
8,044,584 B2   10/2011 Cho et al.
(Continued)

FOREIGN PATENT DOCUMENTS

EP    2 445 029 A1    4/2012
EP    2 637 229 A2    9/2013
(Continued)

OTHER PUBLICATIONS

[NPL-1] Anika et al. (WO 2014/001005 A1); (Jan. 2014) (EPO machine translation to English).*
International Search Report of PCT/EP2015/079913 dated Mar. 7, 2016.
(Continued)

*Primary Examiner* — David Sample
*Assistant Examiner* — Donald M Flores, Jr.
(74) *Attorney, Agent, or Firm* — Armstrong Teasdale LLP

(57) ABSTRACT

The present invention relates to a radiation curable composition. In particular, the present invention relates to a radiation curable composition with hydrophilic nanoparticles for use in barrier stacks for protection of sensitive devices against moisture.

20 Claims, 3 Drawing Sheets

(51) Int. Cl.
*C08K 3/34* (2006.01)
*C09D 4/00* (2006.01)
*C08J 5/18* (2006.01)
*C08K 3/22* (2006.01)
*C09D 7/40* (2018.01)
*C09D 7/61* (2018.01)

(52) U.S. Cl.
CPC .......... *C08K 3/22* (2013.01); *C08K 3/34* (2013.01); *C09D 4/00* (2013.01); *C09D 7/61* (2018.01); *C09D 7/68* (2018.01); *H01L 51/5256* (2013.01); *H01L 51/5259* (2013.01); *C08F 2222/1013* (2013.01); *C08J 2335/02* (2013.01); *C08K 2003/222* (2013.01); *C08K 2003/2206* (2013.01); *C08K 2003/2217* (2013.01); *C08K 2201/011* (2013.01); *H01L 2251/5369* (2013.01)

(58) Field of Classification Search
CPC ..... C08J 5/18; C08J 2335/02; H01L 51/5256; H01L 51/5259; H01L 2251/5369; C08K 3/22; C08K 3/34; C08K 2201/011; C08K 2003/222; C08K 2003/2217; C08K 2003/2206
See application file for complete search history.

(56) References Cited

U.S. PATENT DOCUMENTS

| | | |
|---|---|---|
| 2006/0264526 A1 | 11/2006 | Klare et al. |
| 2008/0157656 A1 | 7/2008 | Liao et al. |
| 2013/0240862 A1* | 9/2013 | Yoo .................. H01L 51/5246 257/40 |
| 2015/0162568 A1 | 6/2015 | Bai et al. |
| 2015/0179976 A1* | 6/2015 | Galand .................. C08K 3/22 257/40 |

FOREIGN PATENT DOCUMENTS

| | | | |
|---|---|---|---|
| JP | 2001237064 A | 8/2001 | |
| WO | 2008/057045 A1 | 5/2008 | |
| WO | 2010/140980 A1 | 12/2010 | |
| WO | 2014/001005 A1 | 1/2014 | |
| WO | 2014/012931 A1 | 1/2014 | |
| WO | WO-2014001005 A1 * | 1/2014 | ............... C09J 7/00 |
| WO | 2016/016156 A1 | 2/2016 | |

OTHER PUBLICATIONS

Christopher A. Lipinski et al., "Experimental and computational approaches to estimate solubility and permeability in drug discovery and development settings," Advanced Drug Delivery Reviews, 2001, pp. 3-26, vol. 46.

* cited by examiner

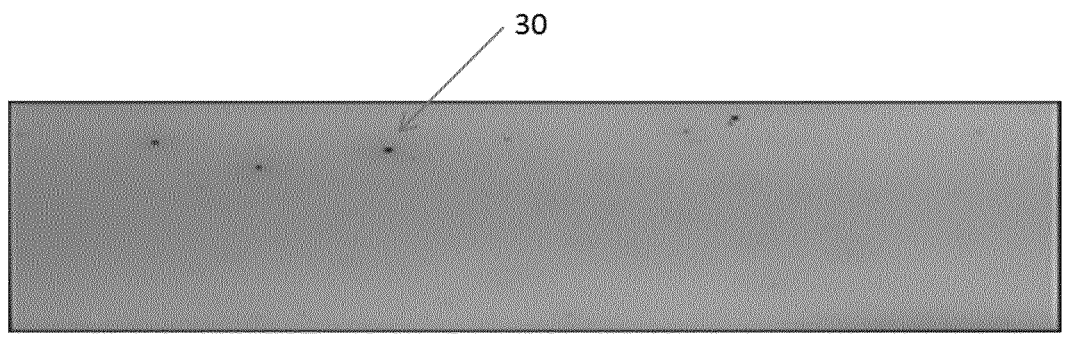
Fig. 4
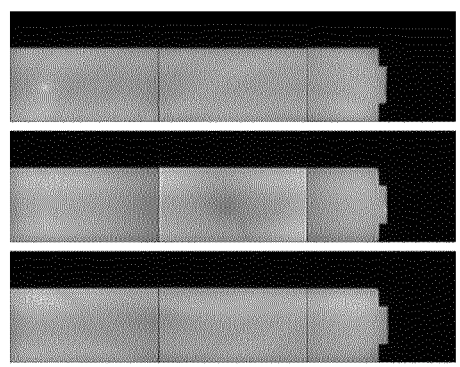
Fig. 5
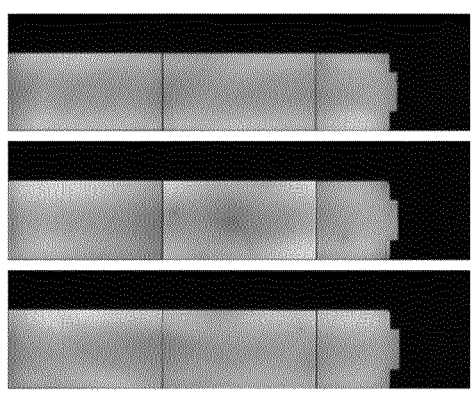

RADIATION CURABLE COMPOSITION COMPRISING HYDROPHILIC NANOPARTICLES

CROSS REFERENCE TO RELATED APPLICATIONS

This application is a National Stage of International Application No. PCT/EP2015/079913 filed Dec. 16, 2015, claiming priority based on European Patent Application No. 14198716.4 filed Dec. 18, 2014, the contents of all of which are incorporated herein by reference in their entirety.

TECHNICAL FIELD

The present invention relates to a radiation curable composition. In particular, the present invention relates to a radiation curable composition with hydrophilic nanoparticles for use in barrier stacks for protection of sensitive devices against moisture.

BACKGROUND OF THE INVENTION

It is well known that moisture has adverse effects on the performance of moisture sensitive devices like organic light emitting diodes and organic photovoltaics. Therefore, barrier stacks comprising organic and inorganic layers are used to encapsulate such sensitive devices and protect them from permeation of moisture.

EP2445029A1 discloses multilayered protective layers for organic opto-electronic devices for example in organic light emitting diodes (OLED). The cathode in an OLED is usually covered by a thick aluminum layer, which acts as a barrier against water. However, due to pinhole defects in such an aluminum layer water penetrates into the cathode layer and oxidizes the metal at the cathode-polymer interface, preventing electron injection from the cathode into the polymer during operation of the device. As a consequence, black spots appear in the bright field of electroluminescence. By applying an organic layer on top of the OLED, the number of black spots can be decreased but there is still a significant number of black spots appearing over time, which affects the use and hence the lifetime of a device. If this organic layer contains moisture absorbing particles, it helps to bind the moisture in the organic layer. A typical concentration of the particles as used in the organic layers of above patent application is about 5 wt %.

Because of the high concentrations of the water absorbing particles, light scattering at the particles of an organic layer causes generation of haze when illuminated with visible light. As long as such layers are, for example, on an OLED device but on the side, which does not emit light, light scattering is not a problem. On the other hand, if the layer is on the light emitting side of an OLED, then haze is very often unwanted and there is the requirement to reduce haze occurrence.

U.S. Pat. No. 8,044,584B2 describes an organic electroluminescent device and compositions with both metal oxide and metal salt particles, a binder and a dispersant for the preparation of moisture absorption layers. It teaches that the moisture absorption ability decreases if the concentration of metal oxide and/or metal salt is less than 2 wt % with regard to the amount of binder. The inventors propose to avoid haze by reducing the average particle diameter of metal oxide and metal salt particles to less than 100 nm. A dispersant is additionally used in the composition to avoid aggregation of the particles in the final moisture absorption layer. Because of the small particle size scattering of visible light does not occur. However, production of particles with an average diameter less than 100 nm is challenging and adds production costs.

With the continuous demand to improve the barrier layer performance without worsening the optical performance of devices using such layers, there is a need to develop improved compositions, which overcome the existing problems. There is also a continuous demand to reduce the manufacturing costs of the organic layer composition without sacrificing the electro-optical performance of a device for which it is employed.

SUMMARY OF THE INVENTION

The object of the present invention is to provide a material composition for manufacturing organic layers for barrier stacks, which do not cause haze for visible light but provide excellent barrier performance, in particular for moisture sensitive opto-electronic devices.

Accordingly, the present invention provides a radiation curable composition comprising a curable material and hydrophilic nanoparticles wherein the ratio of hydrophilic nanoparticles with regard to the weight of the curable material is in the range of 0.01 wt % to 0.9 wt %.

The composition of the invention is preferably for manufacturing organic layers for barrier stacks, for protecting moisture sensitive opto-electronic devices.

Because of the hydrophilic nature of the nanoparticles the moisture absorbing capabilities are improved. An established method to characterize the hydrophilic nature of a material is the calculated logarithm of the partition coefficient (c Log P) as, for example, described in "Experimental and computational approaches to estimate solubility and permeability in drug discovery and development settings", C. A. Lipinski et. al., Advanced Drug Delivery Reviews 46 (2001) 3-26. Preferably, the nanoparticles of the present invention have a c Log P value between n-octanol and water in the range of 0 to +0.5. It has been found that nanoparticles within this range are especially effective in absorbing mois- Although the composition according to the invention comprises a very low concentration of hydrophilic nanoparticles, barrier stacks comprising organic layers made from such composition, surprisingly show strongly improved barrier performance compared with stacks with organic layers made from a similar composition but without moisture absorbing particles. At the same time barrier stacks with organic layers manufactured from a composition according to the invention show almost no haze. A haze value of less than 0.2 for an organic layer manufactured from the composition is typical.

The hydrophilic nanoparticles can be selected from any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. They are advantageously metal oxide particles, preferably alkaline earth metal oxide particles and preferably calcium oxide (CaO), barium oxide (BaO), or magnesium oxide (MgO). A composition may contain different types of nanoparticles.

The size of the nanoparticles may be between 1 and 1000 nm. It is, however, preferred that the average particle diameter of the hydrophilic nanoparticles is less than 300 nm and more preferred less than 200 nm. Further it is preferred that the average particle diameter is between 100 nm and 250 nm and most preferred between 150 and 200 nm.

Preferably, the radiation curable composition according to the present invention comprises hydrophilic nanoparticles in the range of 0.05 wt % to 0.9 wt % of the weight of curable material, more preferred 0.05 wt % to 0.2 wt % and most preferred 0.05 wt % to 0.1 wt % of the weight of curable material.

The curable material may comprise monomers, oligomers and/or polymers. Preferably, the curable material can be polymerized or cross-linked by radiation. The radiation curable composition may comprise more than one monomer, oligomer and/or polymer. The curable material may have mono-functional and/or multi-functional groups which may be independently selected from hydrogen, acrylate, methacrylate, halogenacrylate, such as fluoroacrylate, chloroacrylate; oxetanyl, maleinimidyl, allyl, allyloxy, vinyl, vinyloxy and epoxy groups; preferably acrylate, methacrylate, halogenacrylate, oxetanyl, maleinimidyl, allyl, allyloxy, vinyl, vinyloxy and epoxy groups; and more preferably acrylate or methacrylate groups. Mixtures of different curable materials may be used in order to control the properties of the composition such as, for example, viscosity, degree of crosslinking and thermo mechanical properties. The concentration of the curable material is typically in a range of 1 wt % to 99 wt % of the total weight of the composition. The curable material may exhibit mesophase behavior alone or in mixtures with other compounds or when polymerized.

The radiation curable composition comprising acrylate or methacrylate or any mixture thereof may further comprise acrylate or methacrylate components which may have high hydrophobicity and/or a monofunctional acrylate or methacrylate component or any mixture thereof and/or an acrylate or methacrylate component with functionality higher than 1 or any mixture thereof and/or additional acrylate or methacrylate like polybutadiene acrylate, polybutadiene methacrylate, silicon acrylate, silicon methacrylate, two mole ethoxylate bisphenol A diacrylate, two mole ethoxylate bisphenol A dimethacrylate or any mixtures thereof.

Acrylate or methacrylate components are, for example, 1,12-dodecanediol dimethacrylate, methacrylate composed of a polyol and an ethylenically unsaturated acid include diester monomers each composed of a polyol and an ethylenically unsaturated carboxylic acid, such as 1,3-propanediol dimethacrylate, 1,4-butanediol dimethacrylate, 1,5-pentanediol diacrylate, 1,5-pentanediol dimethacrylate, 1,6-hexanediol diacrylate, 1,6-hexanediol dimethacrylate, 1,7-heptanediol diacrylate, 1,7-heptanediol dimethacrylate, 1,8-octanediol diacrylate, 1,8-octanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, 1,12-dodecanediol dimethacrylate, 1,14-tetradecanediol diacrylate, 1,14-tetradecanediol dimethacrylate, hexyl acrylate, 2-ethylhexyl acrylate, tert-octyl acrylate, isoamyl acrylate, decyl acrylate, isodecyl acrylate, stearyl acrylate, isostearyl acrylate, cyclohexyl acrylate, 4-n-butylcyclohexyl acrylate, bornyl acrylate, isobornyl acrylate, benzyl acrylate, 2-ethylhexyl diglycol acrylate, butoxyethyl acrylate, 2-chloroethyl acrylate, 4-bromobutyl acrylate, butoxymethyl acrylate, 3-methoxybutyl acrylate, alkoxymethyl acrylate, alkoxyethyl acrylate, 2-(2-methoxyethoxy)ethyl acrylate, 2-(2-butoxyethoxy)ethyl acrylate, 2,2,2-trifluoroethyl acrylate, 1 H, 1 H,2H,2H-perfluorodecyl acrylate, 4-butylphenyl acrylate, phenyl acrylate, 2,3,4,5-tetramethylphenyl acrylate, 4-chlorophenyl acrylate, phenoxymethyl acrylate, phenoxyethyl acrylate, glycidyl acrylate, glycidyloxybutyl acrylate, glycidyloxyethyl acrylate, glycidyloxypropyl acrylate, tetrahydrofurfuryl acrylate, hydroxyalkyl acrylate, 2-hydroxyethyl acrylate, 3-hydroxypropyl acrylate, 2-hydroxypropyl acrylate, 2-hydroxybutyl acrylate, 4-hydroxybutyl acrylate, CHMA, CD421A, dimethylaminoethyl acrylate, diethylaminoethyl acrylate, dimethylaminopropyl acrylate, diethylaminopropyl acrylate, trimethoxysilylpropyl acrylate, trimethylsilylpropyl acrylate, polyethylene oxide monomethyl ether acrylate, oligoethylene oxide monomethyl ether acrylate, polyethylene oxide acrylate, oligoethylene oxide acrylate, oligoethylene oxide monoalkyi ether acrylate, polyethylene oxide monoalkyi ether acrylate, dipropylene glycol acrylate, polypropylene oxide monoalkyi ether acrylate, oligopropylene oxide monoalkyi ether acrylate, 2-methacryloyloxyethylsuccinic acid, 2-methylacryloyloxyhexahydrophthalic acid, 2-methacryloyloxyethyl-2-hydroxypropyl phthalate, butoxydiethylene glycol acrylate, trifluoroethyl acrylate, perfluorooctylethyl acrylate, 2-hydroxy-3-phenoxypropyl acrylate, EO-denatured phenol acrylate, EO-denatured cresol acrylate, EO-denatured nonylphenol acrylate, PO-denatured nonylphenol acrylate, EO-denatured 2-ethylhexyl acrylate, hexyl methacrylate, 2-ethylhexyl methacrylate, tert-octyl methacrylate, isoamyl methacrylate, decyl methacrylate, isodecyl methacrylate, stearyl methacrylate, isostearyl methacrylate, cyclohexyl methacrylate, 4-n-butylcyclohexyl methacrylate, bornyl methacrylate, isobornyl methacrylate, benzyl methacrylate, 2-ethylhexyl diglycol methacrylate, butoxyethyl methacrylate, 2-chloroethyl methacrylate, 4-bromobutyl methacrylate, butoxymethyl methacrylate, 3-methoxybutyl methacrylate, alkoxymethyl methacrylate, alkoxyethyl methacrylate, 2-(2-methoxyethoxy)ethyl methacrylate, 2-(2-butoxyethoxy)ethyl methacrylate, 2,2,2-trifluoroethyl methacrylate, 1 H, 1 H,2H,2H-perfluorodecyl methacrylate, 4-butylphenyl methacrylate, phenyl methacrylate, 2,3,4,5-tetramethylphenyl methacrylate, 4-chlorophenyl methacrylate, phenoxymethyl methacrylate, phenoxyethyl methacrylate, glycidyl methacrylate, glycidyloxybutyl methacrylate, glycidyloxyethyl methacrylate, glycidyloxypropyl methacrylate, tetrahydrofurfuryl methacrylate, hydroxyalkyl methacrylate, 2-hydroxyethyl methacrylate, 3-hydroxypropyl methacrylate, 2-hydroxypropyl methacrylate, 2-hydroxybutyl methacrylate, 4-hydroxybutyl methacrylate, dimethylaminoethyl methacrylate, diethylaminoethyl methacrylate, dimethylaminopropyl methacrylate, diethylaminopropyl methacrylate, trimethoxysilylpropyl methacrylate, trimethylsilylpropyl methacrylate, polyethylene oxide monomethyl ether methacrylate, oligoethylene oxide monomethyl ether methacrylate, polyethylene oxide methacrylate, oligoethylene oxide methacrylate, oligoethylene oxide monoalkyi ether methacrylate, polyethylene oxide monoalkyi ether methacrylate, dipropylene glycol methacrylate, polypropylene oxide monoalkyi ether methacrylate, oligopropylene oxide monoalkyi ether methacrylate, 2-methacryloyloxyethylsuccinic acid, 2-methylacryloyloxyhexahydrophthalic acid, 2-methacryloyloxyethyl-2-hydroxypropyl phthalate, butoxydiethylene glycol methacrylate, trifluoroethyl methacrylate, perfluorooctylethyl methacrylate, 2-hydroxy-3-phenoxypropyl methacrylate, EO-denatured phenol methacrylate, EO-denatured cresol methacrylate, EO-denatured nonylphenol methacrylate, PO-denatured nonylphenol methacrylate, EO-denatured 2-ethylhexyl methacrylate, SR307, CN301, SR348L, CN9800, SR351, trifunctional acrylate, trimethylolpropane triacrylate, trimethylolethane triacrylate, alylene oxide-denatured triacrylate of trimethylolpropane, pentaerythritol triacrylate, dipentaerythritol triacrylate, trimethylolpropane tris(acryloyloxypropyl)ether, alkylene-denatured triacrylate of isocyanuric acid, dipentaerythritol propionate triacrylate, tris(acryloyloxyethyl)isocyanurate, hydroxypivalyl aldehyde-denatured dimethylolpropane triacrylate, sorbitol triacrylate, propoxylated trimethylolpropane triacrylate, and ethoxylated glycerin triacrylate, tetrafunctional acrylate include pentaerythritol tetraacrylate, sorbitol tetraacrylate, ditrimethylolpropane tetraacrylate, dipentaerythritol propionate tetraacrylate, and ethoxylated pentaerythritol tetraacrylate. Pentafunctional acrylate includes sorbitol pentaacrylate, and dipentaerythritol pentaacrylate. Hexafunctional acrylate includes dipentaerythritolhexaacrylate, sorbitol hexaacrylate, alkylene oxide-denatured hexaacrylate of phosphazene, and caprolactone-denatured dipentaerythritol hexaacrylate, trifunctional methacrylate, trimethylolpropane trimethacrylate, trimethylolethane trimethacrylate, alylene oxide-denatured trimethacrylate of trimethylolpropane, pentaerythritol trimethacrylate, dipentaerythritol trimethacrylate, trimethylolpropane tris(methacryloyloxypropyl)ether, alkylene-denatured trimethacrylate of isocyanuric acid, dipentaerythritol propionate trimethacrylate, tris(methacryloyloxyethyl)isocyanurate, hydroxypivalyl aldehyde-denatured dimethylolpropane trimethacrylate, sorbitol trimethacrylate, propoxylated trimethylolpropane trimethacrylate, and ethoxylated glycerin triacrylate. Tetrafunctional methacrylate includes pentaerythritol tetramethacrylate, sorbitol tetramethacrylate, ditrimethylolpropane tetramethacrylate, dipentaerythritol propionate tetramethacrylate, and ethoxylated pentaerythritol tetramethacrylate. Pentafunctional methacrylate includes sorbitol pentamethacrylate, and dipentaerythritol pentamethacrylate. Hexafunctional methacrylate includes dipentaerythritol hexamethacrylate, sorbitol hexamethacrylate, alkylene oxide-denatured hexamethacrylate of phosphazene, and caprolactone-denatured dipentaerythritol hexamethacrylate.

The radiation curable composition according to the invention may further comprise one or more radiation active initiators to initiate radical polymerization. Radiation active initiators are preferably radical initiators, more preferably radical photo-initiators. The content of the radiation active initiators is preferably in a range of 0.01% to 10%, more preferably 0.01% to 2% of the total weight of the composition.

Radical photo-initiators to initiate radical photo polymerization are for example Omnirad 248 or Irgacure® 369, benzoins like benzoin, benzoin ethers such as benzoin methyl ether, benzoin ethyl ether, benzoin isopropyl ether, benzoin phenyl ether, and benzoin acetate, acetophenones like acetophenone, 2,2-dimethoxyacetophenone, 2,2-dimethoxy-2-phenylacetophenone and 1,1-dichloroacetophenone, benzyl ketals like benzyl dimethylketal and benzyl diethyl ketal; anthraquinones like 2-methylanthraquinone, 2-ethylanthraquinone, 2-tertbutylanthraquinone, 1-chloroanthraquinone and 2-amylanthraquinone; triphenylphosphine; benzoylphosphine oxides like 2,4,6-trimethylbenzoyl-diphenylphosphine oxide (Lucirin TPO); ethyl-2,4,6-trimethylbenzoylphenylphosphinate; bisacylphosphine oxides; benzophenones like benzophenone and 4,4'-bis(N,N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl) ketone (Irgacure® 2959); 2-methyl-1-[4-(methylthio) phenyl]-2-(4-morpholinyl)-1-propanone; 1-aminophenyl ketones or 1-hydroxy phenyl ketones like 1-hydroxycyclo-hexyl phenyl ketone, 2-hydroxyisopropyl phenyl ketone, phenyl 1-hydroxyisopropyl ketone, and 4-isopropylphenyl 1-hydroxyisopropyl ketone, aliphatic urethane acrylate, aliphatic urethane methacrylate and combinations thereof.

Radical photo-initiators to initiate radical thermal polymerization are for example azo compounds, organic peroxides and inorganic peroxides.

The radiation curable resin composition may include other components, for example monofunctional or multifunctional thiols, cationically polymerizable epoxy polysiloxane compounds, cationic photoinitiator, organic dispersant, organic/inorganic complex dispersant, stabilizers, modifiers, tougheners, antifoaming agents, levelling agents, thickening agents, flame retardants, antioxidants, pigments, dyes and combinations thereof.

Preferably, a radiation curable composition according to the invention comprises:
  1% to 99.98% by weight of polymerizable acrylate and/or methacrylate material;
  hydrophilic nanoparticles in a ratio of 0.01 wt % to 0.9 wt %, preferably 0.05 wt % to 0.5 wt %, more preferably 0.05 wt % to 0.2 wt % and most preferably 0.05 wt % to 0.1 wt % with regard to the weight of the polymerizable material; and
  0.01% to 10% by weight of radical photoinitiator
based on the total weight of the composition.

According to a preferred embodiment of the invention the radiation curable composition comprises:
  hydrophilic nanoparticles in a ratio of 0.01 wt % to 0.9 wt %, preferably 0.05 wt % to 0.5 wt %, more preferably 0.05 wt % to 0.2 wt % and most preferably 0.05 wt % to 0.1 wt % with regard to the weight of the polymerizable material;
  at least one photo initiator, preferably a radical photoinitiator;
  component A: at least one acrylate or methacrylate component with a c log P higher than 2, preferably higher than 4, more preferably higher than 5;
  component B: at least one monofunctional acrylate or methacrylate diluent component, preferably with a viscosity below 40 mPa·s at 20° C.;
  component C: at least one acrylate or methacrylate component with functionality equal or higher than 3, preferably 3 or 4.

Preferably, the radiation curable composition also comprises:
  component D: a polybutadiene acrylate or methacrylate, a silicone acrylate or methacrylate, or a two-mole ethoxylated bisphenol A di(meth)acrylate, or any mixture thereof, whereby such component D exhibits preferably two (meth)acrylate functionalities.

Preferably component B exhibits a C log P higher than 2.
Preferably component C exhibits a C log P higher than 1, and/or component D exhibits a C log P higher than 4, preferably higher than 6 or 7.

Preferably, component A is a 1,n-diol di(meth)acrylate of a diol of the formula $HO-(CH_2)_n-OH$, whereby n is higher than 3, preferably higher than 6, more preferably higher than 10.

A more specific preferred radiation curable composition of the above embodiment comprises:
  hydrophilic nanoparticles in a ratio of 0.01 wt % to 0.9 wt %, preferably 0.05 wt % to 0.5 wt %, more preferably 0.05 wt % to 0.2 wt % and most preferably 0.05 wt % to 0.1 wt % with regard to the weight of the polymerizable material;
  0.1-10% by weight of a photo initiator;
  30-80% by weight of component A, which preferably exhibits two (meth)acrylate functionalities;

5-40% by weight of the monofunctional (meth)acrylate diluent component B;

5-30% by weight of the (meth)acrylate component C with functionality equal or higher than 3; and optionally 0.1-30% by weight of component D;

based on the total weight of the composition.

Another more specific preferred radiation curable composition of the above embodiment comprises:

hydrophilic nanoparticles in a ratio of 0.01 wt % to 0.9 wt %, preferably 0.05 wt % to 0.5 wt %, more preferably 0.05 wt % to 0.2 wt % and most preferably 0.05 wt % to 0.1 wt % with regard to the weight of the polymerizable material;

0.1-5% by weight of a photo initiator;

40-70% by weight of component A, which exhibits preferably two (meth)acrylate functionalities;

10-30% by weight of the monofunctional (meth)acrylate diluent component B;

7-20% by weight of the (meth)acrylate component C with functionality equal or higher than 3; and optionally 0.3-25% by weight of component D;

based on the total weight of the composition.

The hydrophilic nanoparticles can be selected from any of metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride or metalloid oxygen boride particles, zeolite, silica gel, active alumina and activated charcoal. They are advantageously metal oxide particles, preferably alkaline earth metal oxide particles and preferably calcium oxide (CaO), barium oxide (BaO), or magnesium oxide (MgO). A composition may contain different types of nanoparticles.

The size of the nanoparticles may be between 1 and 1000 nm. It is, however, preferred that the average particle diameter of the hydrophilic nanoparticles is less than 300 nm and more preferred less than 200 nm. Further it is preferred that the average particle diameter is between 100 nm and 250 nm and most preferred between 150 and 200 nm.

Examples of component A include CD262 (=1,12-dodecanediol dimethacrylate), methacrylate composed of a polyol and an ethylenically unsaturated acid include diester monomers each composed of a polyol and an ethylenically unsaturated carboxylic acid, such as 1,3-propanediol dimethacrylate, 1,4-butanediol dimethacrylate, 1,5-pentanediol diacrylate, 1,5-pentanediol dimethacrylate, 1,6-hexanediol diacrylate, 1,6-hexanediol dimethacrylate, 1,7-heptanediol diacrylate, 1,7-heptanediol dimethacrylate, 1,8-octanediol diacrylate, 1,8-octanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, 1,12-dodecanediol dimethacrylate, 1,14-tetradecanediol diacrylate, 1,14-tetradecanediol dimethacrylate and the like.

Examples of component B include CHMA, CD421A, hexyl (meth)acrylate, 2-ethylhexyl (meth)acrylate, tert-octyl (meth)acrylate, isoamyl (meth)acrylate, decyl (meth)acrylate, isodecyl (meth)acrylate, stearyl (meth)acrylate, isostearyl (meth)acrylate, cyclohexyl (meth)acrylate, 4-n-butylcyclohexyl (meth)acrylate, bornyl (meth)acrylate, isobornyl (meth)acrylate, benzyl (meth)acrylate, 2-ethylhexyl diglycol (meth)acrylate, butoxyethyl (meth)acrylate, 2-chloroethyl (meth)acrylate, 4-bromobutyl (meth)acrylate, butoxymethyl (meth)acrylate, 3-methoxybutyl (meth)acrylate, alkoxymethyl (meth)acrylate, alkoxyethyl (meth)acrylate, 2-(2-methoxyethoxy)ethyl (meth)acrylate, 2-(2-butoxyethoxy) ethyl (meth)acrylate, 2,2,2-trifluoroethyl (meth)acrylate, 1H, 1H,2H,2H-perfluorodecyl (meth)acrylate, 4-butylphenyl (meth)acrylate, phenyl (meth)acrylate, 2,3,4,5-tetramethylphenyl (meth)acrylate, 4-chlorophenyl (meth)acrylate, phenoxymethyl (meth)acrylate, phenoxyethyl (meth)acrylate, glycidyl (meth)acrylate, glycidyloxybutyl (meth)acrylate, glycidyloxyethyl (meth)acrylate, glycidyloxypropyl (meth)acrylate, tetrahydrofurfuryl (meth)acrylate, hydroxyalkyl (meth)acrylate, 2-hydroxyethyl (meth)acrylate, 3-hydroxypropyl (meth)acrylate, 2-hydroxypropyl (meth)acrylate, 2-hydroxybutyl (meth)acrylate, 4-hydroxybutyl (meth) acrylate, dimethylaminoethyl (meth)acrylate, diethylaminoethyl (meth)acrylate, dimethylaminopropyl (meth)acrylate, diethylaminopropyl (meth)acrylate, trimethoxysilylpropyl (meth)acrylate, trimethylsilylpropyl (meth)acrylate, polyethylene oxide monomethyl ether (meth)acrylate, oligoethylene oxide monomethyl ether (meth)acrylate, polyethylene oxide (meth)acrylate, oligoethylene oxide (meth)acrylate, oligoethylene oxide monoalkyl ether (meth)acrylate, polyethylene oxide monoalkyl ether (meth)acrylate, dipropylene glycol (meth)acrylate, polypropylene oxide monoalkyl ether (meth)acrylate, oligopropylene oxide monoalkyl ether (meth)acrylate, 2-methacryloyloxyethylsuccinic acid, 2-methylacryloyloxyhexahydrophthalic acid, 2-methacryloyloxyethyl-2-hydroxypropyl phthalate, butoxydiethylene glycol (meth)acrylate, trifluoroethyl (meth)acrylate, perfluorooctylethyl (meth)acrylate, 2-hydroxy-3-phenoxypropyl (meth)acrylate, EO-denatured phenol (meth)acrylate, EO-denatured cresol (meth)acrylate, EO-denatured nonylphenol (meth)acrylate, PO-denatured nonylphenol (meth)acrylate, and EO-denatured 2-ethylhexyl (meth)acrylate.

Examples of component C include SR351, trimethylolpropane tri(meth)acrylate, trimethylolethane tri(meth)acrylate, alylene oxide-denatured tri(meth)acrylate of trimethylolpropane, pentaerythritol tri(meth)acrylate, dipentaerythritol tri(meth)acrylate, trimethylolpropane tris ((meth)acryloyloxypropyl)ether, alkylene-denatured tri (meth)acrylate of isocyanuric acid, dipentaerythritol propionate tri(meth)acrylate, tris((meth)acryloyloxyethyl) isocyanurate, hydroxypivalyl aldehyde-denatured dimethylolpropane tri(meth)acrylate, sorbitol tri(meth)acrylate, propoxylated trimethylolpropane tri(meth)acrylate, and ethoxylated glycerin triacrylate.

Specific examples of tetrafunctional (meth)acrylate include pentaerythritol tetra(meth)acrylate, sorbitol tetra(meth)acrylate, ditrimethylolpropane tetra(meth)acrylate, dipentaerythritol propionate tetra(meth)acrylate, and ethoxylated pentaerythritol tetra(meth)acrylate.

Specific examples of pentafunctional (meth)acrylate include sorbitol penta(meth)acrylate, and dipentaerythritol penta(meth)acrylate.

Specific examples of hexafunctional (meth)acrylate include dipentaerythritol hexa(meth)acrylate, sorbitol hexa (meth)acrylate, alkylene oxide-denatured hexa(meth)acrylate of phosphazene, and caprolactone-denatured dipentaerythritol hexa(meth)acrylate.

Examples of component D are polydiene (meth)acrylates like polybutadiene (meth)acrylate, polydiene di(meth)acrylates like polybutadiene di(meth)acrylate as SR307 and CN301 from Sartomer, polyisoprene diacrylate and the like, 2 mole alkoxylated bisphenol A di(meth)acrylate as 2 mole ethoxylated bisphenol A di(meth)acrylate as SR348L, silicone (meth)acrylates and silicone di(meth)acrylates like CN9800.

Preferably, in a radiation curable composition according to the invention more than 80 wt % of the composition are components with a boiling point higher than 180° C. at 760 mmHg, more preferred higher than 200° C. at 760 mmHg, and most preferred higher than 220° C. at 760 mmHg.

More preferred is that in a radiation curable composition according to the invention more than 90 wt % of the composition are components with a boiling point higher than 180° C. at 760 mmHg, more preferred higher than 200° C. at 760 mmHg, and most preferred higher than 220° C. at 760 mmHg.

Even more preferred is that in a radiation curable composition according to the invention more than 95 wt % of the composition are components with a boiling point higher than 180° C. at 760 mmHg, more preferred higher than 200° C. at 760 mmHg, and most preferred higher than 220° C. at 760 mmHg.

Most preferred is that in a radiation curable composition according to the invention more than 99 wt % of the composition are components with a boiling point higher than 180° C. at 760 mmHg, more preferred higher than 200° C. at 760 mmHg, and most preferred higher than 220° C. at 760 mmHg.

The radiation curable composition of the present invention preferably is solvent free, which has the advantage that no processing steps to remove the solvent are required, thereby avoiding any risk that the solvent vapors are trapped inside the layer or elements where such composition is used to prepare protective layers. In addition, time and costs for production of organic layers are reduced. In the context of the present application a solvent shall mean a material, which is part of the composition, but is removed after coating or printing the composition to form a layer, for example by heating.

Preferably, the radiation curable composition according to the invention exhibits a viscosity at 20° C. below 500 mPa·s, preferably below 200 mPa·s and most preferably below 60 mPa·s.

According to another aspect of the invention there is provided a method for manufacturing an organic layer using the radiation curable composition according to the invention comprising the steps of:

depositing the composition on a rigid or flexible substrate or an in-organic layer, optionally heating the composition and;

polymerizing the composition with radiation, preferably actinic radiation.

For deposition of the composition any known coating and printing technique such as spin-coating, roll coating, inkjet printing, vapor deposition, spray coating and slot-die coating can be used.

Coating of the composition may be done in vacuum. Preferably, coating of the composition is done under a pressure below 100 mbar or below 10 mbar, more preferred below 1 mbar or below 0.1 mbar and most preferred below 0.01 mbar.

Polymerization of the coated composition is carried out by radiation. Radiation means for example, heat or actinic radiation. For actinic radiation UV and/or visible light is preferred.

According to another aspect of the present invention, the radiation curable composition of the present invention is used to manufacture a protective layer against moisture in opto-electronic devices for example in organic light emitting diode devices. Preferably, the radiation curable composition is used to manufacture an organic layer as a part of a barrier stack for protecting moisture sensitive opto-electronic elements or devices. Preferably, the haze of such an organic layer is less than 0.3% and more preferred less than 0.2%. Although the concentration of hydrophilic nanoparticles in the composition is in the range 0.01 to 0.9% of the weight of the curable material the corresponding barrier stack shows superior water absorbing capability. Similar levels of concentrations of hydrophilic nanoparticles are also present in the organic layer processed from such compositions.

The organic layer prepared using the above composition is used for example in a barrier stack for encapsulation in a multi dyad configuration, preferably in a single dyad configuration and more preferred in a double dyad configuration. A dyad as used in the context of this application shall mean a stack comprising an organic layer sandwiched between two inorganic layers. There may be additional layers between any of the inorganic layers and the organic layer. The organic layer is a polymerized product of the above composition. A double dyad shall mean a configuration, which comprises two dyads. There may be additional layers between two dyads or the two dyads may be in direct contact. In the latter case the two dyads may share one inorganic layer, such that the double dyad comprises two organic layers and three inorganic layers, like in the configurations of FIGS. 1 and 2.

Preferably, dyads comprising an organic layer made from the composition of the invention are transparent for light, preferably for visible light.

Preferably, organic layers made from the composition of the invention have a thickness between 1 μm and 100 μm.

A method for manufacturing a dyad configuration comprises steps of depositing a first inorganic layer and then depositing onto the first inorganic layer a composition according to the present invention, curing this composition with radiation to produce a first organic layer and further depositing a second inorganic layer. Depending on the number of dyads desired this stack of organic layer sandwiched between two inorganic layers can be progressively processed. A double dyad configuration functions as double barrier stack with organic layers and can be used in various organic light emitting devices such as OLED for example in top emitting mode as shown in FIG. 1 and in bottom emitting mode as shown in FIG. 2 and other opto-electronic devices.

Preferably, the hydrophilic nanoparticles are uniformly distributed in the organic layer.

An organic layer according to the above description may have additional optical and/or electrical functional features than described above. The organic layers prepared with a composition according to the invention may maintain adequate storage modulus to prevent deterioration of the layer, or maintain adequate adhesive strength with respect to the inorganic layer and have less curing shrinkage rates.

The above composition and organic layer according to the present invention can be used in any organic light emitting diode, organic photovoltaics, organic field effect transistors, flexible electronics, flexible substrates, batteries, medical packaging, food packaging and liquid crystal displays.

BRIEF DESCRIPTION OF THE DRAWINGS

The invention is further illustrated by the accompanying drawing figures. It is emphasized that the various features are not necessarily drawn to scale.

FIG. 3 shows the occurrence of black spots in a bottom emitting opto-electronic device.

FIG. 4 shows the top view of three bottom emitting opto-electronic devices before reliability test.

FIG. 5 shows the top view of three bottom emitting opto-electronic devices after reliability test.

DETAILED DESCRIPTION OF THE INVENTION

Figure 1:
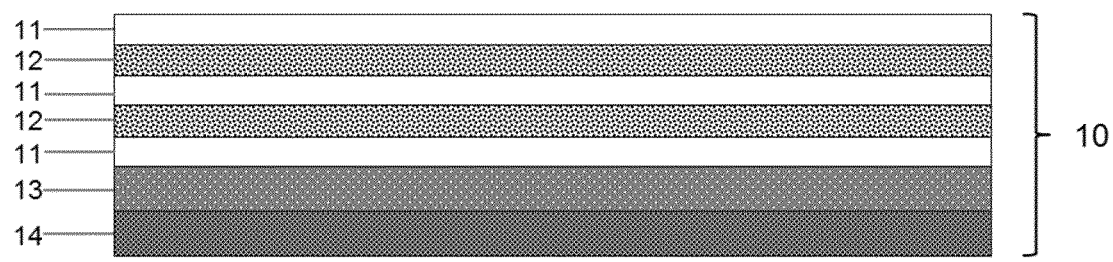
FIG. 1 shows a top emitting opto-electronic device 10 with an encapsulation stack comprising a double dyad configuration with organic layers 12 comprising low concentration of hydrophilic nanoparticles as well as inorganic layers 11, substrate 14 and opto electronic element 13.

Even though the compositions according to the present invention comprise a very low amount of hydrophilic nanoparticles, superior water absorption properties are observed.

EXAMPLES

The commercially available components listed in table 1 are used to prepare the compositions used in the examples.

TABLE 1

| Trade Name | Supplier | Chemical Name | Boiling Point at 760 mmHG | Structure |
|---|---|---|---|---|
| SR595 | Arkema | 1,10-decanediol diacrylate | ~371° C. | 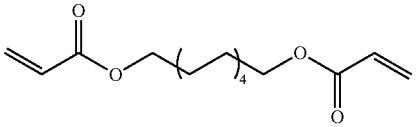 |
| SR351 | Arkema | Trimethylolpropane triacrylate | 390° C. | 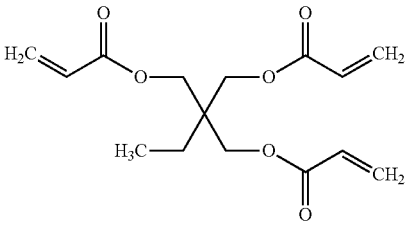 [SMILES: C=CC(=O)OCC(CC)(COC(=O)C=C)COC(=O)C=C] |
| SR307 | Arkema | Poly(butadiene) diacrylate | (Polymer) | 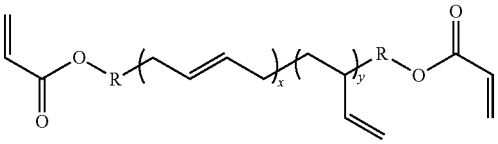 |
| SR421A | Arkema | Isophoryl methacrylate | ~258° C. | 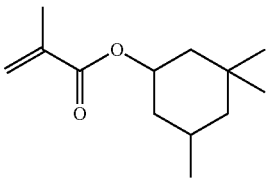 |
| Omnirad 248 | IGM resins | 2-Benzyl-2-(dimethylamino)-4'-morpholino-butyrophenone | | 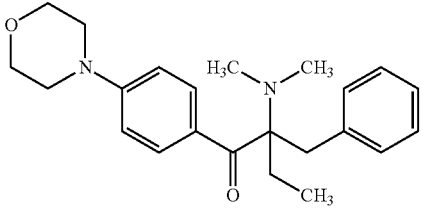 [SMILES: CCC(Cc1ccccc1)(C(=O)c1ccc(N2CCOCC2)cc1)N(C)C] |
| CaO | Strem | Calcium Oxide | | |
| MgO | Strem | Magnesium Oxide | | |
| BaO | Strem | Barium Oxide | | |
| Lucidot NZL 40 | Clariant | Nanozeolite | | |
| CN9010EU | Sartomer | Aliphatic urethane acrylate | | |

The calculated logarithm of partition coefficient c Log P between n-octanol and water for CaO, MgO and BaO is +0.33.

Example 1

Preparation of Composition 1

A preliminary composition is prepared by mixing together SR595, SR351, SR307, SR421A and Omnirad248 according to the wt % in table 2 and stirring at 300 rpm at room temperature for 2 hours. The mixture is then dried over 4 Å molecular sieves (preliminary activated in a vacuum oven at 140° C. for 24 hours) during 24 hours, then filtered prior to the use for the preparation of the final composition.

Calcium oxide particles were dried in an oven as described in WO 2014/012931 and then mixed according to wt % in table 2 with the above preliminary composition in order to obtain dispersions. The dispersion is then milled using a DynoMill equipment for about two hours to obtain a dispersion of particles with an average size <200 nm and a final composition 1 is obtained.

Example 2

Preparation of Composition 2

Composition 2 is prepared in the same manner as in example 1, except that calcium oxide particles of 0.1% of the total weight of the composition are used as in table 2.

Example 3

Preparation of Composition 3

Composition 3 is prepared in the same manner as in example 1, except that calcium oxide particles of 0.05% of the total weight of the composition are used as in table 2.

TABLE 2

| Components | Composition 1 [wt %] | Composition 2 [wt %] | Composition 3 [wt %] |
| --- | --- | --- | --- |
| SR307 | 17.060 | 17.080 | 17.090 |
| SR595 | 48.370 | 48.420 | 48.440 |
| SR351 | 9.480 | 9.490 | 9.490 |
| CD421A | 22.800 | 22.820 | 22.830 |
| Omnirad 248 | 2.090 | 2.090 | 2.100 |
| CaO | 0.200 | 0.100 | 0.050 |
| Total (weight %) | 100.00 | 100.00 | 100.00 |

Each of the compositions 1-3 is solvent free.

Example 4

Preparation of Composition 4

Composition 4 is prepared in the same manner as in example 1, except that the components are mixed as in table 3 and barium oxide particles are used.

Example 5

Preparation of Composition 5

Composition 5 is prepared in the same manner as in example 4, except that barium oxide particles of 0.1% of the total weight of the composition are used as in table 3.

Example 6

Preparation of Composition 6

Composition 6 is prepared in the same manner as in example 4, except that barium oxide particles of 0.05% of the total weight of the composition are used as in table 3.

TABLE 3

| Components | Composition 4 [wt %] | Composition 5 [wt %] | Composition 6 [wt %] |
| --- | --- | --- | --- |
| SR307 | 17.060 | 17.080 | 17.090 |
| SR595 | 48.370 | 48.420 | 48.440 |
| SR351 | 9.480 | 9.490 | 9.490 |
| CD421A | 22.800 | 22.820 | 22.830 |
| Omnirad 248 | 2.090 | 2.090 | 2.100 |
| BaO | 0.200 | 0.100 | 0.050 |
| Total (weight %) | 100.00 | 100.00 | 100.00 |

Each of the compositions 4-6 is solvent free.

Example 7

Preparation of Composition 7

Composition 7 is prepared in the same manner as in example 1, except that the components are mixed as in table 4 and magnesium oxide particles are used.

Example 8

Preparation of Composition 8

Composition 8 is prepared in the same manner as in example 7, except that magnesium oxide particles of 0.1% of the total weight of the composition are used as in table 4.

Example 9

Preparation of Composition 9

Composition 9 is prepared in the same manner as in example 7, except that magnesium oxide particles of 0.05% of the total weight of the composition are used as in table 4.

TABLE 4

| Components | Composition 7 [wt %] | Composition 8 [wt %] | Composition 9 [wt %] |
| --- | --- | --- | --- |
| SR307 | 17.060 | 17.080 | 17.090 |
| SR595 | 48.370 | 48.420 | 48.440 |
| SR351 | 9.480 | 9.490 | 9.490 |
| CD421A | 22.800 | 22.820 | 22.830 |
| Omnirad 248 | 2.090 | 2.090 | 2.100 |
| MgO | 0.200 | 0.100 | 0.050 |
| Total (weight %) | 100.00 | 100.00 | 100.00 |

Each of the compositions 7-9 is solvent free.

Example 10

The average diameter of particle dispersion in compositions 1 to 9 is measured using dynamic light scattering equipment (DLS), a zetasizer Nano S from malvern instruments. Details about this method to measure particle diameter can be found in: "Nanomaterials: Processing and Characterization with Lasers", Chapter 8, Size determination of Nanoparticles by Dynamic Light Scattering from S. C. Singh, H. Zeng, C. Guo and W. Cai; DOI: 10.1002/9783527646821.ch8.

The measurement results of the average particle diameter are listed in table 5. The average particle diameter is between 100 nm to 200 nm.

TABLE 5

| Composition | Avg. particle diameter (nm) |
|---|---|
| Composition 1 | 172.4 |
| Composition 2 | 172.4 |
| Composition 3 | 172.4 |
| Composition 4 | <200 |
| Composition 5 | <200 |
| Composition 6 | <200 |
| Composition 7 | 116 |
| Composition 8 | 116 |
| Composition 9 | 116 |

Example 11

Haze and water absorption is measured for the films prepared using compositions 1 to 9. The compositions are applied on glass substrate using a bar coater with a wire bar of 50 μm, then the homogenous film coating is cured with UV light (395 nm) with an exposure dose of 4 J/cm² in an inert atmosphere resulting in a cured film with a thickness of 30 μm to 35 μm ready for measurements. The results are summarized in table 6.

Determination of Haze

Measurement is done according to the standard ASTM D1003 "Standard Test Method for Haze and Luminous Transmittance of Transparent Plastics". Transmission Haze is the percent of transmitted light that is scattered more than 2.5° from the direction of the incident beam. Materials with haze values greater than 30% are considered diffusing.

Transmissive Haze is calculated as $H = Tdiffuse/Ttotal \times 100\%$

Measurement of Transmissive Haze of films coated on a substrate has been performed with the Kontron Spectrophotometer UVIKON 810 (P12/301142). Compositions 1 to 9 have been coated on glass and cured with UV light under inert atmosphere using UV LED @395 nm with UV energy dose of 4 J/cm² and measured for haze. The measurement error is +/−0.1%

Measurement of Water Absorption

The water absorption of cured samples of the compositions 1 to 9 was measured in order to determine the amount of water that each material is able to absorb. Samples of compositions 1 to 9 were placed in different aluminum cups (roughly 1.5 g of composition) and cured under inert atmosphere using UV LED @ 395 nm with 4 J/cm² of UV dose. The cured solid part was then placed in 40° C./90% RH storage conditions. Due to water absorption, the weight of the sample increased over time. The sample weight was monitored over time until the weight became constant, which represents the saturation level from which the water absorption (weight %) was calculated. This is intrinsically a determination of the water gettering capacity of the dispersions.

TABLE 6

| Composition | Avg. particle diameter (nm) | Haze (%) at 540 nm | Haze (%) at 600 nm | Water absorption (%) |
|---|---|---|---|---|
| Composition 1 | 172.4 | 0.2 | 0 | 0.44 |
| Composition 2 | 172.4 | 0 | 0 | 0.4 |
| Composition 3 | 172.4 | 0.1 | 0.1 | 0.38 |
| Composition 4 | <200 | 0 | 0 | 0.41 |
| Composition 5 | <200 | 0.1 | 0.1 | 0.42 |
| Composition 6 | <200 | 0.2 | 0.2 | 0.35 |
| Composition 7 | 116 | 0.2 | 0.2 | 0.33 |
| Composition 8 | 116 | 0.2 | 0.1 | 0.33 |
| Composition 9 | 116 | 0 | 0 | 0.29 |

Occurrence of Black Spots

When moisture permeates into the OLED device, black spots 30 appear as shown in FIG. 3, which affects the performance of the device for example by reduction of light intensity. A good OLED should have very low black spot rejects when subjected to reliability tests at 60° C./90% RH for a long duration.

Example 12

Figure 2:
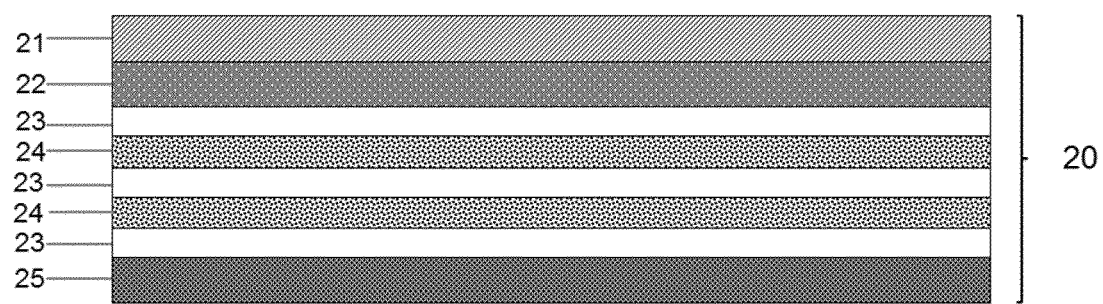
FIG. 2 shows a double dyad configuration in a bottom emitting opto-electronic device 20 with an encapsulation stack comprising two organic layers 24 with low concentration of hydrophilic nanoparticles, cover 21, substrate 25, opto electronic element 22 and inorganic layers 23.

A bottom emitting type OLED device 20 with a double dyad configuration as in FIG. 2, is prepared, wherein the organic layers 24 in the double dyad configuration are made from composition 2.

Three top emitting type OLED devices 10 with double dyad configurations as in FIG. 1 were prepared, wherein the organic layers 12 in the double dyad configurations were made using composition 2. The OLED devices were then subjected to a reliability test for 2000 h at 60° C. and 90% relative humidity (RH) and were observed regarding degradation of the optical performance due to black spot occurrence.

FIG. 4 shows three OLED devices in emission mode before the reliability test.

FIG. 5 shows three OLED devices in emission mode after reliability test for 2000 h at 60° C./90% RH As seen from FIG. 5, no black spots are observed in all of the devices after the reliability tests.

Figure 6:
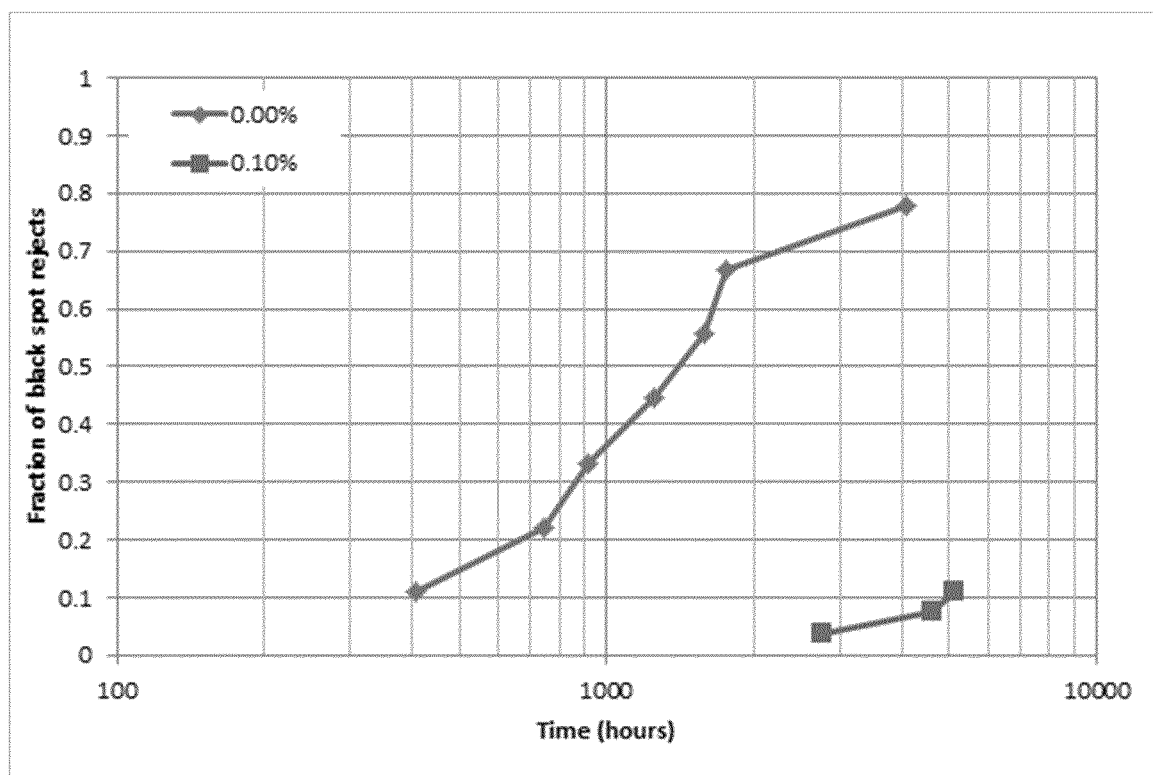
FIG. 6 shows a graph with fraction of black spot rejects during the reliability test time at 60° C. and 90% relative humidity. The comparison is between stacks made from compositions without (0.00%) and with 0.1 wt % hydrophilic nanoparticles used to prepare organic layers.

FIG. 6 shows a graph depicting fraction of black spot rejects for the above devices with organic layers 24 in a double dyad configuration containing 0.1% calcium oxide nanoparticles in comparison to a device wherein the organic layer has no hydrophilic nanoparticles. The device is subjected to reliability test at 60° C./90% RH for long duration.

As seen from FIG. 6, the radiation curable composition of the present invention with very low amount of nanoparticles shows superior performance when used in opto-electronic devices.

Example 13

Preparation of Composition 10

A preliminary composition is prepared by mixing together CN9010EU, SR595, SR351, Omnirad248 according to the wt % in table 7 and stirring at 300 rpm at room temperature for 2 hours. The mixture is then dried over 4 Å molecular sieves (preliminary activated in a vacuum oven at 140° C. for 24 hours) during 24 hours, then filtered prior to the use for the preparation of the final composition.

Zeolite particles (Lucidot NZL 40) were dried in an oven between 200° C.-400° C. and then mixed according to wt % in table 7 with the above preliminary composition in order to obtain dispersions. The dispersion is then milled using a DynoMill equipment for about two hours to obtain a dispersion of particles with an average size <200 nm and a final composition 10 is obtained.

TABLE 7

| Components | Composition 10 [wt %] | Composition 11 [wt %] | Composition 12 [wt %] |
|---|---|---|---|
| CN9010EU | 25.870 | 25.950 | 25.980 |
| SR595 | 51.740 | 51.900 | 51.950 |
| SR351 | 19.900 | 19.960 | 19.980 |
| Omnirad 248 | 1.990 | 1.990 | 1.990 |
| Lucidot NZL 40 | 0.500 | 0.200 | 0.100 |
| Total (weight %) | 100.00 | 100.00 | 100.00 |

Example 14

Preparation of Composition 11

Composition 11 is prepared in the same manner as in example 13, except that zeolite particles of 0.2% of the total weight of the composition are used as in table 7.

Example 15

Preparation of Composition 12

Composition 12 is prepared in the same manner as in example 13, except that zeolite particles of 0.1% of the total weight of the composition are used as in table 7.

The invention claimed is:

1. A radiation curable composition for use in barrier stacks for protection of sensitive devices against moisture, comprising:
    a curable material;
    hydrophilic nanoparticles, wherein the proportion of hydrophilic nanoparticles is in the range of 0.01 wt % to 0.9 wt % of the weight of the curable material, and wherein the hydrophilic nanoparticles comprise metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride, or metalloid oxygen boride particles;
    at least one monomer of an acrylate or a methacrylate; and
    at least one radiation active initiator.

2. The radiation curable composition according to claim 1, wherein the proportion of hydrophilic nanoparticles is in the range of 0.05 wt % to 0.2 wt % of the weight of curable material.

3. The radiation curable composition according to claim 1, wherein the monomer is mono-functional or multi-functional.

4. The radiation curable composition according to claim 1, the composition further comprising:
    the hydrophilic nanoparticles in a ratio of 0.05 wt % to 0.5 wt % with regard to the weight of the curable material;
    at least one photo initiator;
    component A: at least one acrylate or methacrylate component with a c log P higher than 2;
    component B: at least one monofunctional acrylate or methacrylate diluent component with a viscosity below 40 mPa·s at 20° C.; and
    component C: at least one acrylate or methacrylate component with functionality equal or higher than 3.

5. The radiation curable composition according to claim 4, further comprising a component D, which is at least one of a polybutadiene acrylate or methacrylate, a silicone acrylate or methacrylate, or a two-mole ethoxylated bisphenol A di(meth)acrylate, or any mixture thereof, whereby such component D exhibits two acrylate or methacrylate functionalities.

6. The radiation curable composition according to claim 4, comprising:
    the hydrophilic nanoparticles in a ratio of 0.05 wt % to 0.2 wt % with regard to the weight of the curable material;
    0.1-10 wt % of the at least one photo initiator;
    30-80 wt % of component A, which exhibits two acrylate or methacrylate functionalities;
    5-40 wt % of monofunctional acrylate or methacrylate diluent component B;
    5-30 wt % of acrylate or methacrylate component C with functionality equal or higher than 3; and optionally
    0.1-30 wt % of a component D, which is at least one of a polybutadiene acrylate or methacrylate, a silicone acrylate or methacrylate, or a two-mole ethoxylated bisphenol A di(meth)acrylate, or any mixture thereof, whereby such component D exhibits two acrylate or methacrylate functionalities;
    based on the total weight of the composition.

7. The radiation curable composition according to claim 4, comprising:
    the hydrophilic nanoparticles in a ratio of 0.05 wt % to 0.1 wt % with regard to the weight of the curable material;
    0.1-5 wt % of the at least one photo initiator;
    40-70 wt % of component A, which exhibits two acrylate or methacrylate functionalities;
    10-30 wt % of the monofunctional acrylate or methacrylate diluent component B;
    7-20 wt % of the acrylate or methacrylate component C with functionality equal or higher than 3; and optionally
    0.3-25 wt % of a component D, which is at least one of a polybutadiene acrylate or methacrylate, a silicone acrylate or methacrylate, or a two-mole ethoxylated bisphenol A di(meth)acrylate, or any mixture thereof, whereby such component D exhibits two acrylate or methacrylate functionalities; based on the total weight of the composition.

8. The radiation curable composition according to claim 1, characterized in that more than 80 wt % of the composition are components with a boiling point higher than 180° C. at 760 mmHg.

9. The radiation curable composition according to claim 1, characterized in that it contains no solvent.

10. The radiation curable composition according to claim 1, wherein the hydrophilic nanoparticles have an average particle diameter less than 200 nm.

11. The radiation curable composition according to claim 1, wherein the hydrophilic nanoparticles comprise zeolite.

12. The radiation curable composition according to claim 11, wherein the hydrophilic nanoparticles further comprise calcium oxide or barium oxide or magnesium oxide or mixtures thereof.

13. The radiation curable composition according to claim 1, wherein the hydrophilic nanoparticles have a calculated logarithm of partition coefficient between n-octanol and water in the range of 0 to +0.5.

14. An organic layer, which has been manufactured from the composition according to claim 1.

15. The organic layer according to claim 14, wherein the thickness of the layer is 1 μm to 100 μm.

16. An article comprising the organic layer according to claim 14, wherein the article is at least one of organic light emitting diodes, organic photovoltaics, organic field effect transistors, flexible electronics, flexible substrates, batteries, medical packaging, food packaging and liquid crystal displays.

17. A barrier stack for protecting moisture sensitive opto-electronic elements or devices, comprising an organic layer comprising the radiation curable resin composition according to claim 1.

18. An organic layer for encapsulating opto-electronic elements or devices in a multi dyad configuration, the organic layer comprising the radiation curable resin composition according to claim 1.

19. A method of manufacturing an organic layer using the radiation curable composition according to claim 1 comprising:
   bringing the composition in contact with a rigid or flexible substrate or an inorganic layer, optionally heating the composition and;
   polymerizing the composition with radiation.

20. A barrier stack for protection of a sensitive device against moisture, comprising:
   an organic layer comprising a curable material and hydrophilic nanoparticles, wherein the proportion of hydrophilic nanoparticles is in the range of 0.01 wt % to 0.9 wt % of the weight of the curable material, and wherein the hydrophilic nanoparticles comprise metal, metal oxide, metalloid, metalloid oxide, metal carbide, metalloid carbide, metal halide, metal salts, metal perchlorate, metal nitride, metalloid nitride, metal oxygen nitride, metalloid oxygen nitride, metal oxygen boride, or metalloid oxygen boride particles; and
   at least one inorganic layer coupled to the organic layer, the at least one inorganic layer configured to be positionable closer to the sensitive device than the organic layer.

* * * * *